United States Patent
Watanabe et al.

[11] Patent Number: 6,156,663
[45] Date of Patent: Dec. 5, 2000

[54] METHOD AND APPARATUS FOR PLASMA PROCESSING

[75] Inventors: Katsuya Watanabe, Kudamatsu; Saburo Kanai, Hikari; Ryoji Hamasaki, Hikari; Tsuyoshi Yoshida, Hikari; Yutaka Omoto, Hikari; Masayuki Kojima, Kokubunji; Syunji Sasabe, Irima; Tadamitsu Kanekiyo, Kudamatsu; Takazumi Ishizu, Hikari, all of Japan

[73] Assignee: Hitachi, Ltd., Tokyo, Japan

[21] Appl. No.: 08/721,732

[22] Filed: Sep. 27, 1996

[30] Foreign Application Priority Data

Oct. 3, 1995  [JP]  Japan .................................. 7-255972
Apr. 25, 1996  [JP]  Japan .................................. 8-104951

[51] Int. Cl.$^7$ .................................................. H01L 21/00
[52] U.S. Cl. .......................... 438/695; 438/696; 438/733
[58] Field of Search .......................... 118/723 R, 723 S, 118/723 IR, 723 MW; 156/345; 438/695, 696, 733

[56] References Cited

U.S. PATENT DOCUMENTS

| | | | |
|---|---|---|---|
| 4,960,488 | 10/1990 | Law et al. | 438/694 |
| 5,006,220 | 4/1991 | Hijikata et al. | |
| 5,078,833 | 1/1992 | Kadomura | 438/696 |
| 5,085,727 | 2/1992 | Steger | 156/345 |
| 5,423,945 | 6/1995 | Marks et al. | 438/738 |
| 5,624,529 | 4/1997 | Shul et al. | 438/718 |

FOREIGN PATENT DOCUMENTS

| | | |
|---|---|---|
| 0601468 | 6/1994 | European Pat. Off. |
| 0648858 | 4/1995 | European Pat. Off. |
| 60-169140 | 9/1985 | Japan |
| 63-107024 | 5/1988 | Japan |

OTHER PUBLICATIONS

J. Coburn, "Increasing—Plasma Etching", IBM Technical Disclosure Bulletin, vol. 19, No. 10, p. 3854, Mar. 1997.

Journal of Vacuum Science and Technology: Part A, vol. 10, No. 4 PT I, Jul. 1, 1992, pp. 1232–1237, Marx W F et al., "Electron Cycloton Resonance Etching of Aluminum Alloys With BC13–C12–N2".

"Electron Cycloton Resonance Etching of Aluminum alloys with $BCl_3$–$Cl_2$–$N_2$" pp. 1232–1237, Journal of Vacuum Science & Technology, vol. A10, No. 4.

*Primary Examiner*—Randy Gulakowski
*Assistant Examiner*—Shamim Ahmed
*Attorney, Agent, or Firm*—Antonelli, Terry, Stout & Kraus, LLP

[57] ABSTRACT

Provided is a method of processing a sample by generating plasma by an electromagnetic wave, wherein a material containing carbon, such as silicon carbide (Sic), is disposed in a vacuum container serving as a discharge region. The inside of an etching chamber is cleaned by $O_2$ cleaning treatment by using a sheet type dry etching apparatus, and after an inner wall temperature of the etching chamber is set and controlled, a sample is conveyed into the etching chamber, and a TiN cap layer, an Al—Cu alloy layer and a TiN barrier layer are plasma-etched in order by using $BCl_3$/$Cl_2$/$CH_4$/Ar gases with the pattern of a resist film as a mask.

11 Claims, 7 Drawing Sheets

METHOD AND APPARATUS FOR PLASMA PROCESSING

BACKGROUND OF THE INVENTION

This invention relates to a method, or an apparatus, for processing a sample by generating plasma by an electromagnetic wave. More particularly, the present invention relates to a semiconductor fabrication process, and can be suitably applied to an etching process of a metal wiring film.

Figure 7:
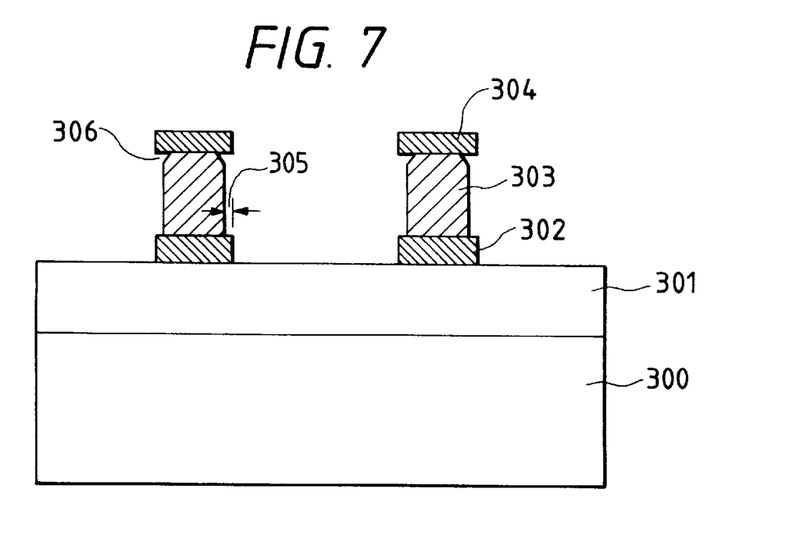
FIG. 7 shows the sectional shape of a conventional Al wiring.

Al wirings of LSIs mostly employ a three-layered structure comprising a TiN cap layer/an Al—Cu alloy/a TiN barrier layer. Dry etching by a $BCl_3/Cl_2$ gas has been widely employed for patterning this wiring. In $BCl_3/Cl_2$ type etching, an etching rate of the Al—Cu alloy is higher than that of TiN. Therefore, there occurs the problems that side etching 305 occurs on the Al—Cu alloy layer 303 and notches 306 occur in the Al—Cu alloy layer 303 immediately below the TiN cap layer 303 as shown in FIG. 7 which shows the sectional shape of the multi-layered Al wiring according to the prior art. To accomplish an excellent processing shape, etching of the Al wiring must be carried out while controlling the formation of a side wall protective film. To cope with this problem, reduction of the notches 306 and anisotropic processing of the Al—Cu alloy layer 303 are attained by adding $N_2$ to the $BCl_3/Cl_2$ type gas as described, for example, in "Journal of Vacuum Science & Technology", Vol. A10, No. 4, pp. 1232–1237. The side wall protective film by this means contains BN compounds resulting from the reaction between B from $BCl_3$ and N of the TiN layer, and the side wall protective film is more effective for controlling the shape than conventional $BCl_3/Cl_2$ type etching.

The method described above which adds $N_2$ to the $BCl_3/Cl_2$ type etching gas efficiently forms the side wall protective film containing the BN compound and reduces the notches 306. However, the side wall protective film containing the BN compound involves the problem that it can not be removed easily by the ashing step and the solution treatment carried out in succession to the etching step because it has chemically strong bonds. Since the formation/deposition reaction of the BN compound occurs on the inner wall of the etching chamber, foreign matters tend to develop in the etching apparatus, and the problem occurs when this method is applied to the mass-production of the LSIs. Therefore, means for forming the side wall protective film in place of the BN compound, which is strong and firm and yet can not be easily removed after etching, becomes necessary.

Japanese Laid-Open No. 169140/1985 shows plasma etching method of aluminium or aluminium alloy under reduced pressure as a conventional art. This conventional art discloses that R.F. power of 13.45 MHz frequency is applied to an electrode on which a wafer is set, and etching gases including $BCl_3$, $Cl_2$ and CH4 are supplied to an etching apparatus so that fast and anisotropic etching can be achieved without damaging photoresist using low R.F power.

Requirements for a semiconductor production process utilizing plasma have become very severe, and processing accuracy, a processing shape, a selection ratio (processing speed ratio between materials), uniformity and a processing speed must be simultaneously satisfied.

A technology of forming side wall protective film has been employed in an etching process of a laminate metal wiring in order to conduct vertical processing.

A material forming a side wall protective film is mainly supplied from a photoresist. Therefore, when a selection ratio to the photoresist is increased, the supply of the material forming the side wall protective film becomes insufficient and etching in the transverse direction proceeds, so that vertical processing becomes difficult to conduct. When the material forming the side wall protective film is supplied sufficiently so as to conduct vertical processing, on the contrary, the etching speed of the photoresist must be unavoidably increased, and the selection ratio to the photoresist becomes small. In this way, processing accuracy and the processing shape have a mutual trade-off relation with the selection ratio.

On the other hand, the plasma also etches the photoresist using a plasma etching, the etched photoresist attaches to side walls of a sample, and it acts as a protective layer of the side walls. However recently there are such type of semiconductor devices appeared that the area of photoresist layer is comparatively smaller than that of entire etched surface, for example, ASIC or logic semiconductor devices. For example, a wafer is covered with an area of photoresist having 30% or smaller than 30% of entire wafer surface area. In other words, the wafer is etched with an area of exposed surface having 70% or larger than 70% of entire wafer surface area.

When etching such type of wafer, the quantity of the etched photoresist is small. Therefore the quantity of etched photoresist is not sufficient to form protective layers of side walls for controlling a shape.

The process described in Japanese Laid-Open No. 169140/1985 shows the fast and anisotropic etching method with relatively low R.F power, and the method achieves to reduce a damage of the photoresist, however, there is no suggestion about the action of protective layers of side walls.

SUMMARY OF THE INVENTION

It is the first object of the present invention to provide a plasma processing method, and an apparatus for the method, which remove the trade-off relation of processing accuracy and the processing shape with the selection ratio, and simultaneously satisfy processing accuracy, the processing shape and the selection ratio.

It is the second object of the present invention to provide an etching method so as to obtain a desired etching shape when using a sample which has a larger etched surface area than the area of photoresist mask.

It is third object of the present invention to provide an etching method so as to form protective layers which can control shapes of side walls during etching process and to easily remove the protective layers after etching process.

A method and an apparatus for accomplishing the first object described above will be given below.

To simultaneously satisfy processing accuracy and the processing shape along with the selection ratio, the supply of a material (mainly, carbon) as the material of the side wall protective film may be supplied from sources other than the photoresist. If a material serving as the material of the side wall protective film exists in plasma in an amount necessary for conducting vertical processing of an object article for processing, the photoresist need not be positively etched. Therefore, the selection ratio to the resist can be increased to a large value.

For this purpose, it is possible to employ a method which disposes a carbon-containing material such as silicon carbide (SiC) at at least a part of the inside of a vacuum container serving as a discharge region, a method which covers the wall of the vacuum container with a carbon-containing material such as silicon carbide (SiC), etc, a method which covers the surface of a sample table with a carbon-containing material such as silicon carbide (SiC), and so forth.

In a plasma processing apparatus for processing a sample by generating plasma by an electromagnetic wave, the surface of a material placed inside a vacuum container functioning as a discharge region is exposed to the resulting plasma and is etched by the plasma, so that materials constituting the surface of the vacuum container are emitted into the plasma.

When a carbon-containing material such as silicon carbide (SiC) is placed inside the vacuum container serving as the discharge region, the surface of the vacuum container is etched and silicon (Si) and carbon (C) are emitted into the plasma. Since carbon (C) so emitted into the plasma functions as a side wall protective film of the article to be processed, vertical processing becomes possible. Therefore, it becomes unnecessary to etch the photoresist so as to supply the material for the side wall protective film, and the etching speed of the photoresist can be lowered while the processing shape of the object article is kept vertical. In other words, the selection ratio to the photoresist can be improved.

The above second object is accomplished by etching a sample with the plasmatized etching gases comprising an organic component, wherein 30% or below 30% of the sample's entire surface is covered with photoresist area. And it is also accomplished by etching a sample with the plasmatized etching gases comprising an organic component, wherein 70% or above 70% of the sample's entire surface is exposed without any photoresist thereon.

The above third object is accomplished by forming a side wall protective film of an organic material.

Therefore, after an etching chamber of an etching apparatus in which a sample is processed one by one is cleaned by $O_2$ plasma to remove organic matters, the multi-layered Al wiring is etched by plasma by using a mixed gas of $BCl_3$, $Cl_2$, $CH_4$ and Ar and using an organic resist film as a mask while the wall surface temperature of the chamber is controlled to a predetermined temperature within the range of 80 to 250° C. Gas mass flow rate ratios at this time with respect to $Cl_2$ of 100 are 5 to 50, 1 to 20 and 50 to 500 for $BCl_3$, $CH_4$ and Ar, respectively. The $O_2$ plasma cleaning described above may be carried out either continuously for a plurality of wafers or on a per-wafer basis.

According to the present invention, the organic components isolated from $CH_4$ efficiently form the side wall protective film. Therefore, side etching and the notches can be restricted, and the multi-layered Al wiring can be etched with an excellent processing shape. Since Ar is added, the thickness of the side wall protective film can be controlled by its sputtering effect and controllability of the processing shape can be further improved. The side wall protective film formed by the system described above can be easily removed by ordinary post-treatment steps. Further, the addition of $CH_4$ does not affect the maintenance property of the etching apparatus.

Ordinarily, when etching containing the organic type gas such as $CH_4$ as the addition gas is applied to mass production, the change with time occurs in the processing shape, but the present invention makes it possible to apply the system to the mass production by periodically removing the organic matters inside the chamber by $O_2$ cleaning and controlling the wall surface temperature to accomplish stability of the etching atmosphere and its reproducibility.

DETAILED DESCRIPTION OF PREFERRED EMBODIMENTS

Embodiment 1

Figure 1:
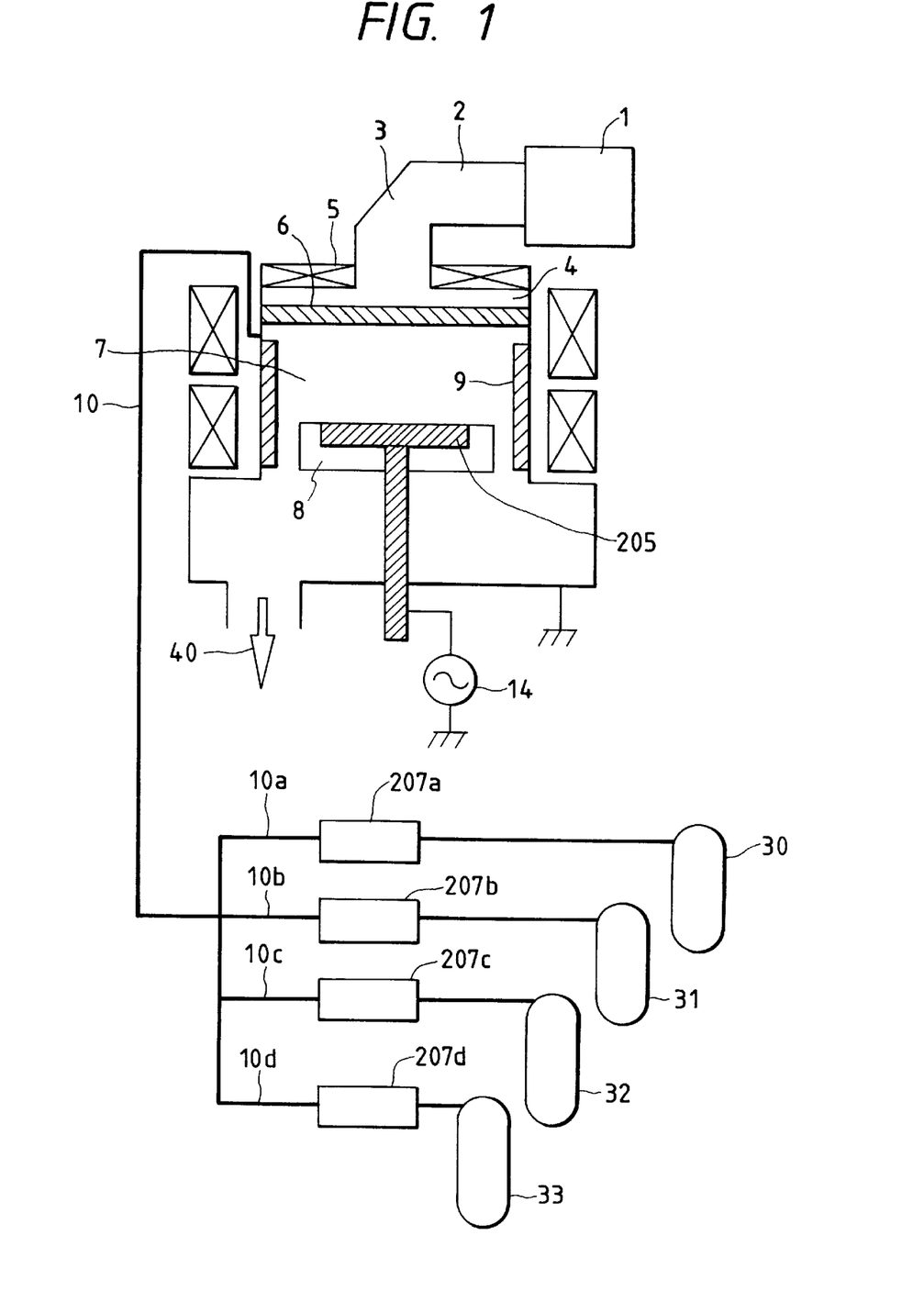
FIG. 1 shows an embodiment of the present invention wherein a cylinder made of silicon carbide (SiC) is disposed along the inner surface of a vacuum container of a semiconductor production apparatus.

An example of the present invention will be explained with reference to FIGS. 1 and 2. This example represents the case where a cylinder of silicon carbide (SiC) is placed on the inner surface of the vacuum container for a semiconductor production apparatus as a material containing carbon (C). A microwave and a magnetic field are utilized as means for generating the plasma, and a metal wiring film TiN/Al/TiN is etched by using a chlorine gas (Cl2) in this example. FIG. 1 is a conceptual view of the construction of the apparatus and FIG. 2 is a conceptual view of etching of the metal wiring film TiN/Al/TiN placed on a sample table inside the apparatus.

In FIG. 1, reference numeral 1 denotes a magnetron for generating a microwave, reference numeral 2 a waveguide for transmitting the microwave, reference numeral 3 denotes a circle-to-rectangle conversion waveguide, reference numeral 4 denotes a hollow portion for resonating and exciting the microwave, reference numeral 5 denotes a solenoid coil for generating a magnetic field, reference numeral 6 denotes an electromagnetic wave transmission member (for example, a quartz flat plate), reference numeral 7 denotes a vacuum container, reference numeral 8 denotes a holder for mounting an article to be treated, reference numeral 9 denotes an inner cylinder made of silicon carbide (SiC), reference numeral 10 denotes a gas introduction passage, reference numeral 40 denotes a direction for evacuating the vacuum container 7 to vacuum; a variable valve for regulating the pressure of the vacuum container, and a vacuum pump for rough suction are connected to the vacuum container 7 and they are not described in FIG. 1. Reference numeral 14 denotes an RF (radio frequency) power source for applying an RF bias voltage for etching to the holder.

Figure 2:
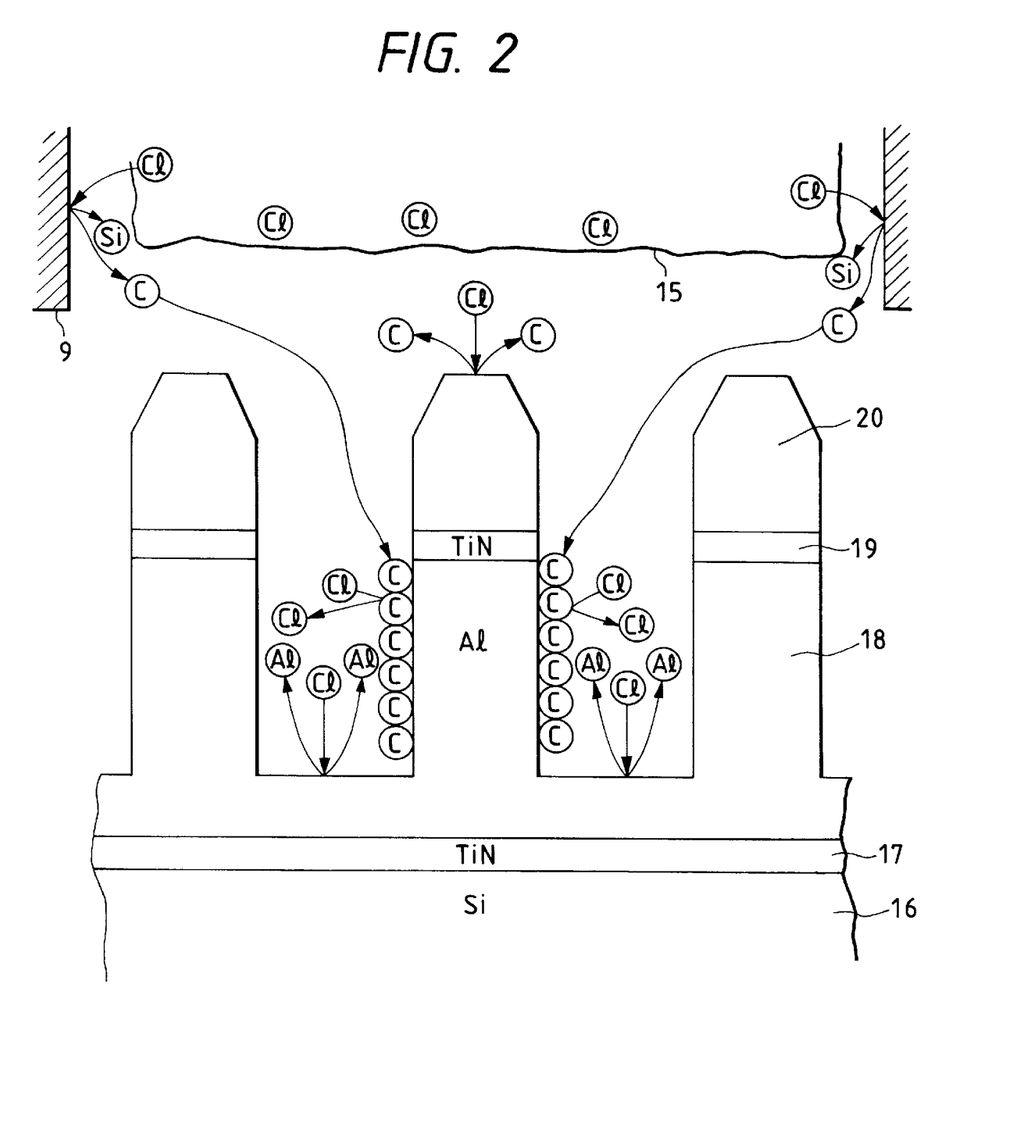
FIG. 2 is a conceptual view of the etching reaction occurring on the surface of an object article to be processed (metal wiring film) placed inside the semiconductor production apparatus shown in FIG. 1.

In FIG. 2, reference numeral 9 denotes an inner cylinder made of silicon carbide (SiC), reference numeral 15 denotes the generated plasma, reference numeral 16 denotes a Si substrate as the sample supported by the holder 8, reference numeral 17 denotes a TiN barrier layer of a laminate metal wiring film, reference numeral 18 denotes an Al layer of the laminate metal wiring film, reference numeral 19 denotes a TiN cap layer of the laminate metal wiring film, and reference numeral 20 denotes a photoresist.

The microwave generated by the magnetron 1 passes through the waveguide 2 and the circle-to-rectangle conversion waveguide 3, and is guided into the vacuum container 7 through the hollow portion 4 and the electromagnetic wave transmission member 6. The inside of the vacuum container 7 is evacuated to vacuum by the turbo molecular pump and the vacuum pump for rough suction. When the sample is processed, the process gas is introduced into the vacuum container 7 through the gas introduction passage 10. The variable valve is disposed so as to regulate the internal pressure of the vacuum container 7. The solenoid coil 5 is disposed round the vacuum container 7, and the magnetic field exists inside the vacuum container 7. The electron is efficiently accelerated by the interaction between the magnetic field and the electromagnetic wave, impinges against the ion and generates the plasma 15. The plasma 15 generated inside the vacuum container 7 diffuses towards the wall and impinges against the surface of the inner cylinder 9 of silicon carbide (SiC). In this instance, the surface of the inner cylinder 9 made of silicon carbide (SiC) is etched, and carbon (C) is isolated into the plasma 15.

Etching of Al 18, TiN 17 and 19 of the laminate metal wiring film is carried out by chlorine (Cl) in the plasma. Particularly, etching of Al by chlorine (Cl) is isotropic but because carbon (C) supplied from the surface of the inner cylinder 9 made of silicon carbide (SiC) adequately exists in the plasma 15, carbon (C) covers the surface of Al 18 and functions as a protective film. In consequence, etching does not proceed. The RF bias is applied to the plane parallel to the Si substrate 16, carbon (C) is removed from the surface of Al 18 and etching proceeds.

However, because the RF bias is not applied to the plane vertical to the Si substrate 16, carbon (C) is not removed from the surface of Al 18 and etching does not proceed. Consequently, the etching shape of Al becomes vertical.

Incidentally, it is possible to use a SiC sintered body having a thickness of about 1 to about 30 mm or a carbon cylinder coated with high purity SiC having a thickness of dozens of microns to several millimeters, as the inner cylinder made of silicon carbide (SiC).

Similar effects can be obtained by using an inner cylinder made of carbon in place of the inner cylinder 9 made of silicon carbide (SiC). When the oxygen gas plasma is used for cleaning, however, the inner cylinder made of carbon involves the problem that its consumption is greater than the inner cylinder made of silicon carbide (SiC).

Though the explanation given above represents the example of the TiN/Al/TiN laminate film, the material and the structure of the object article to be etched are not limited thereto. Needless to say, the present invention is effective for an Al alloy film containing Si, Cu, etc, in place of Al or films containing Ti, W, Si, etc, in place of TiN of the upper/lower layers (e.g. TiW, WSi, Ti, W, amorphous silicon). However, the effect described above is particularly remarkable in two or more multi-layered films in comparison with a single layered film of metals.

The gas to be used is not limited to the chlorine single gas, and similar effects can be obtained by using gases containing chlorine.

Figure 6:
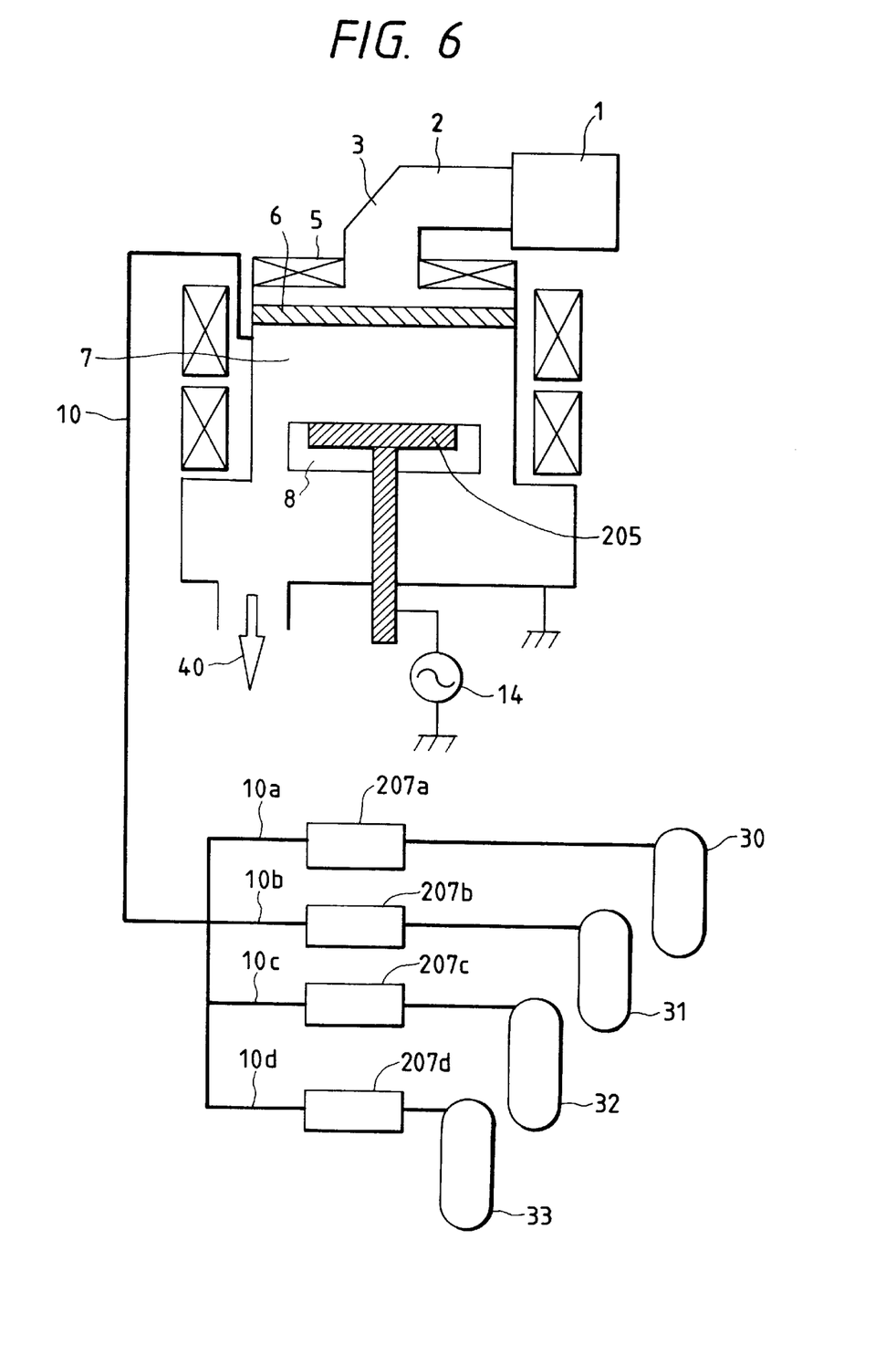
FIG. 6 is a schematic view of an etching apparatus when using etching gases as the embodiment of the present invention.

The mass flow controllers 207a, 207b, 207c, 207d can adjust the flow rate of respective gas from $BCl_3$ bomb 30, $Cl_2$ bomb 31, $CH_4$ bomb 32, and Ar bomb 33, a synergistic effect can be obtained about metal wiring shape therefore when using the etching gases which will be mentioned later.

When a bromine-containing gas is used, the effect becomes somewhat lower than that of the chlorine-containing gas but is approximately similar to the latter.

Embodiment 2

The second example of the present invention will be explained with reference to FIG. 3. This example represents the case where the sample table of the semiconductor production apparatus is covered with a cover of silicon carbide (SiC).

Figure 3:
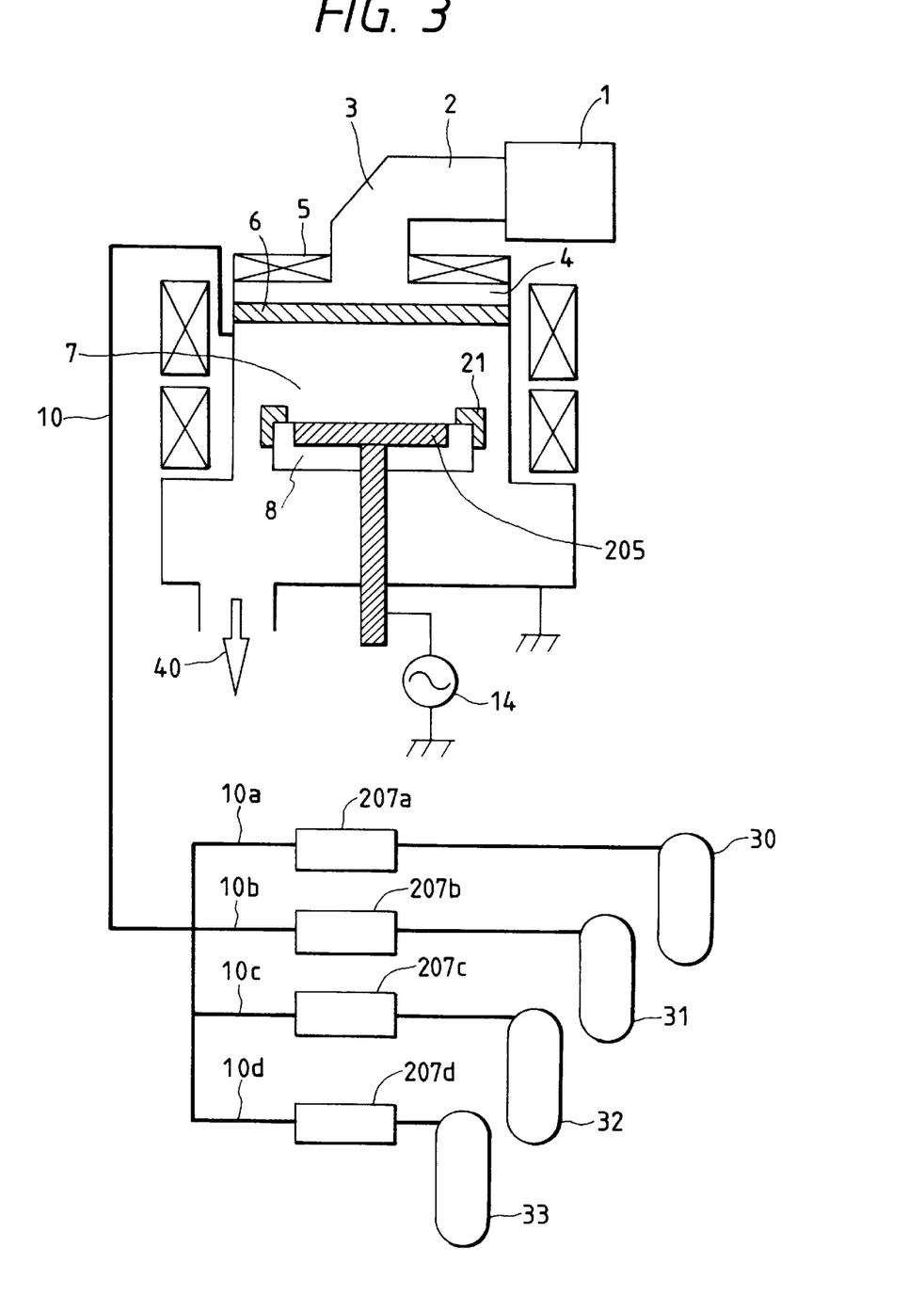
FIG. 3 shows another embodiment of the present invention wherein a sample table of a semiconductor production apparatus is covered with silicon carbide (SiC).

In FIG. 3, reference numeral 21 denotes a cover of silicon carbide (SiC). Other constituent elements are the same as those of FIG. 1.

This example is similar to Example 1 with the exception that the supply of carbon (C) is made from the cover 21 of silicon carbide (SiC). However, this example can be made more effectively because the supply of carbon (C) is made from a point closer to the periphery of the sample. Incidentally, carbon or silicon carbide (SiC) has electrical conductivity.

Therefore, when an electrostatic absorption film is used for the sample table, an insulator is preferably disposed between the cover 21 and the sample table so as to eliminate D.C. leak between the sample table and the plasma.

Embodiment 3

Figure 4:
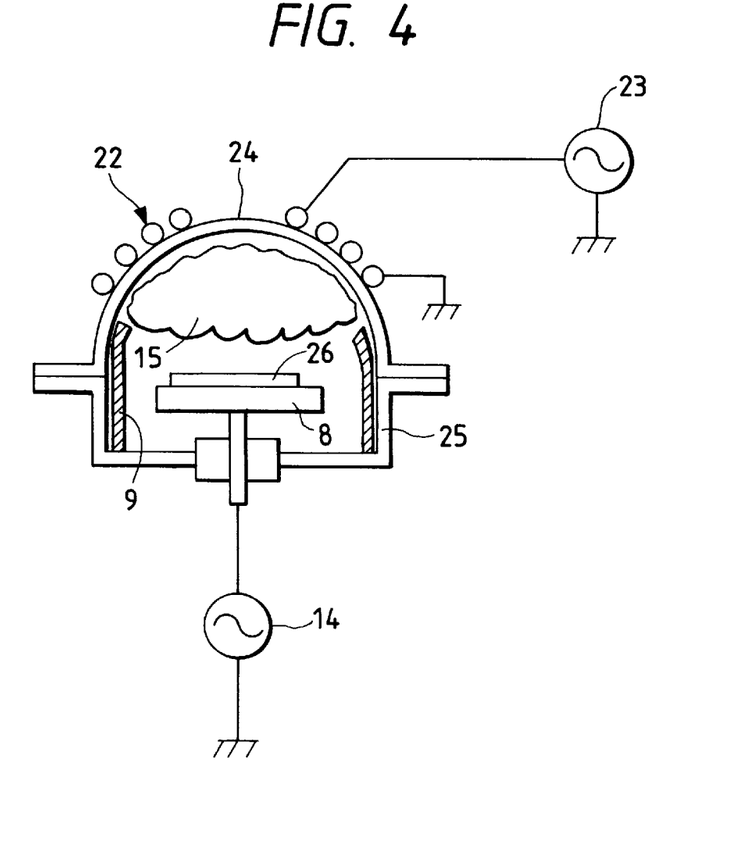
FIG. 4 shows another embodiment of the present invention wherein a cylinder made of silicon carbide (SiC) is disposed along the inner surface of a vacuum container of a semiconductor production apparatus.

FIGS. 1 and 3 represent the examples where the plasma is generated by microwave power and the magnetic field, but the method of generating the plasma is not at all limited thereto. FIG. 4 shows an example where the plasma 15 is generated by applying the output of an RF power source 23 of 1 to 20 MHz to a coil 22. An object article 26 is placed on a holder 8. RF power is applied into the plasma through a dielectric 24. An inner cylinder 9 of a carbon-containing material such as silicon carbide (SiC) is disposed inside a vacuum container comprising the dielectric 24 and a metallic container 25, and the effect similar to that of FIG. 1 can be obtained.

Embodiment 4

Figure 5A:
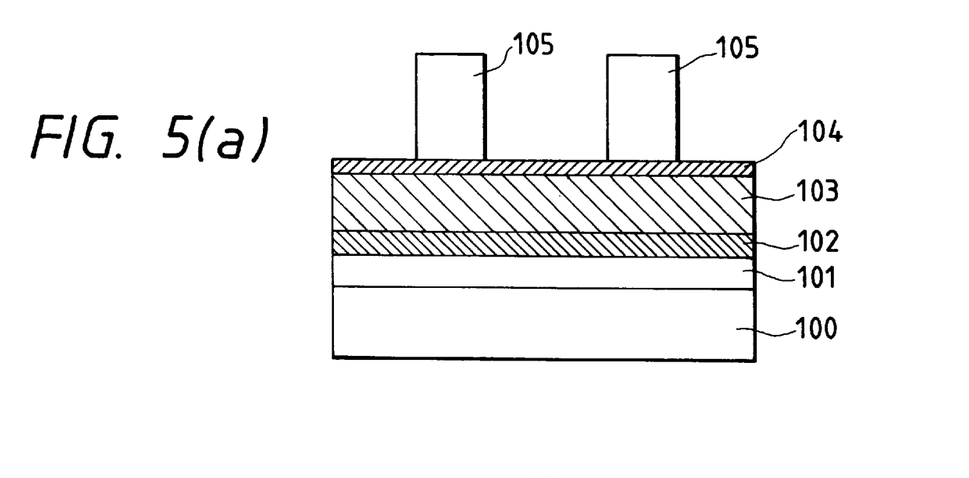
FIGS. 5(a),(b), and (c) respectively show the section view of a sample when using etching gases as the embodiment of the present invention.

An embodiment of the present invention will be explained with reference to FIG. 5 which is a sectional view of a sample and FIG. 6 which is a schematic view of an etching apparatus. A sample having an insulating film 101, a TiN barrier layer 102, an Al—Cu alloy layer 103, the TiN cap layer 104 and a resist film 105 having a desired pattern and disposed on a TiN cap layer 104 that are deposited in order on a semiconductor substrate 100 as shown in FIG. 5(a), is charged into a sample exchange chamber of a microwave etching apparatus having a magnetic field. The micro-wave ($\mu$ wave) generated by a magnetron 1 inside the etching apparatus is transmitted through a waveguide 2 and an introduction window 6 into the etching chamber 7, as shown in FIG. 6, where it undergoes electron-cyclotron resonance with the magnetic field generated by a magnetic field control coil 5 and generates a high density plasma. A radio frequency (RF) power source 14 is connected to a sample holder 8, and an RF bias can be applied independently. Before the sample is charged into the etching chamber 7, $O_2$ cleaning processing is carried out so as to remove organic matters inside the etching chamber. The cleaning conditions include an O2 flow rate of 100 sccm, a total gas pressure of 2 Pa and a micro-wave ($\mu$ wave) output of 800 W. After the inner wall temperature of the etching chamber is set and controlled to 100° C., the sample is conveyed into the etching chamber 7, and the TiN cap layer 104, the Al—Cu alloy layer 103 and the TiN barrier layer 102 are serially etched by using the resist film 105 as a pattern mask. When the main etching condition at this time is the gas flow rates of $BCl_3$: 20 sccm, $Cl_2$: 80 sccm, $CH_4$: 4 sccm, a total gas pressure of 2 Pa, a microwave output of 800 W, RF power of 60 W and a substrate temperature of 40° C. as the case (1), the result shown in FIG. 5(*b*) can be obtained. When the gas flow rates are $BCl_3$: 20 sccm, $Cl_2$: 80 sccm, $CH_4$: 4 sccm and Ar: 96 sccm and a total gas pressure is 3 Pa as the case (2), the result shown in FIG. 5(*c*) can be obtained. Here, other etching conditions are the same as those shown in FIG. 5(*b*). Here, control of the gas flow rates is all effected by mass flow control by using a flow rate controller 207. Incidentally, after etching of the TiN barrier layer 102 judged by a plasma emission monitor is completed, too, etching is continued successively for 15 seconds.

Figure 5B:
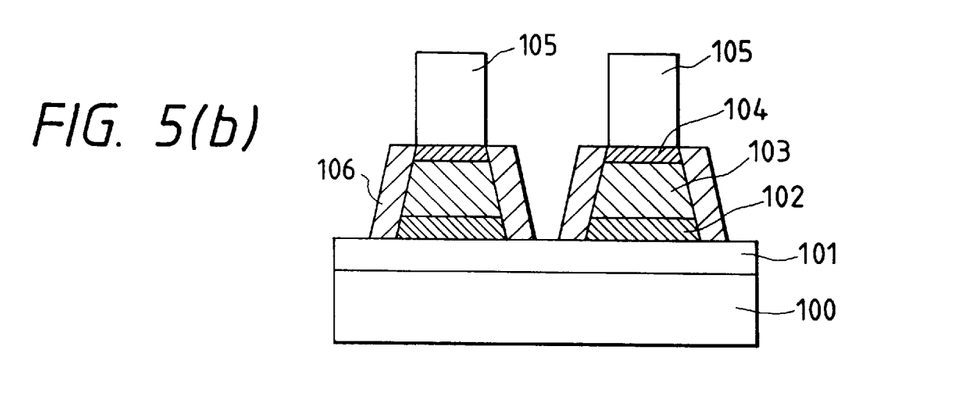

The sectional shape of the sample after completion of the etching treatment is shown in FIG. 5(*b*) as to the case (1), that is, the side wall protective layers are formed, and it is understood that the etched shape can be controlled. The side wall protective layers are made from organic components, like C, CH etc. which are included in plasma of $CH_4$ gas as treatment gas. The components of the protective layers are the same as that of organic resist mask. Therefore the protective layers can be removed by the same process as resist ashing process. In FIG. 5(*b*), the sectional shape is forwardly tapered (downwardly expanding taper as shown in the drawing) because the side wall protective film due to $CH_4$ is too thick, that is, organic components like C, CH in the plasma attach to side walls, the organic components becomes a mask which expands as a tapered shape due to excessive organic components.

The thickness of side wall protective layer can be controlled by changing a flow rate of $CH_4$ gas. Vertical etching can be accomplished by adjusting the flow rate of $CH_4$ gas.

The above process is effective when manufacturing ASIC or logic devices because area of patterned resist mask is smaller than that of etched portion, especially when the ratio of the resist mask to the etched portion is 3:7 or so, the above process is effective.

That is, if the resist mask area is 30% or more than of the entire sample surface, for example, when the resist mask is 40% of the entire sample surface, part of resist mask is sputtered by the action of ions in the plasma, part of the sputtered resist attach to side walls to form protective layers.

However since the quantity of the sputtered resist is small, the action of forming protective layers is insufficient, when the area of resist mask is 30% or below 30% of entire sample surface.

In the above process, organic components like $CH_4$ gas which are the same as the resist mask can be supplied to the plasma, therefore side wall protective layers are formed effectively even when the resist mask area of the sample is small.

Figure 8A:
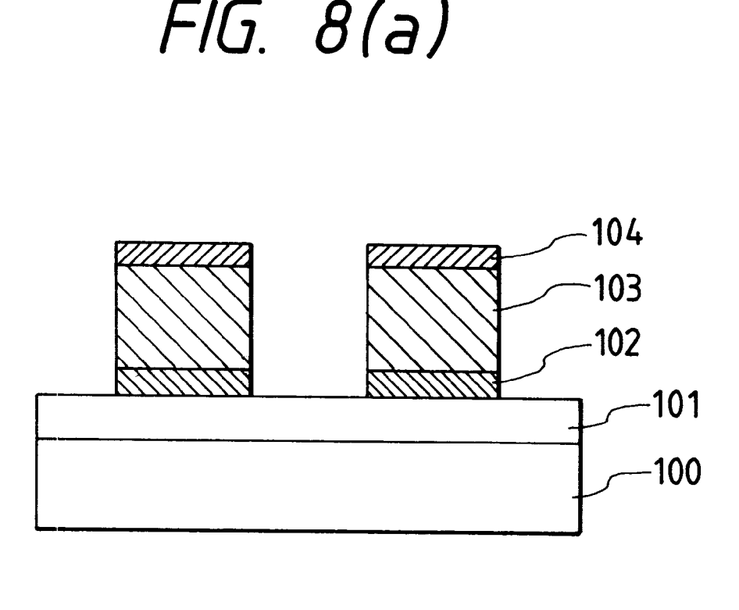
FIG. 8 shows the section view of an example of a semiconductor device manufactured using the present invention.

Furthermore the above process can accomplish the vertical etching under minimum side wall protective layer, for example, the dimensions of the multi-layered wiring structure as follows can be accomplished by the above etching process, the width of the wiring layer is 0.5 $\mu$m or less than 0.5 $\mu$m, the width of pattern is 0.5 $\mu$m or less than 0.5 $\mu$m, the depth of the wiring layer is 0.5 $\mu$m or more than 0.5 $\mu$m, as shown FIG. 8(*a*).

Figure 8B:
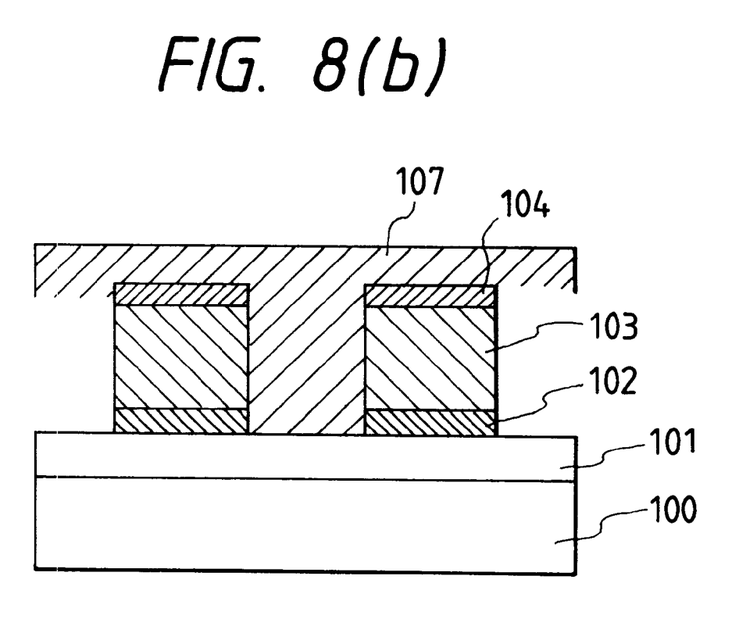

As shown in FIG. 8(*b*), semiconductor devices can be manufactured by forming insulator 107 on the minute etched portion.

Figure 5C:
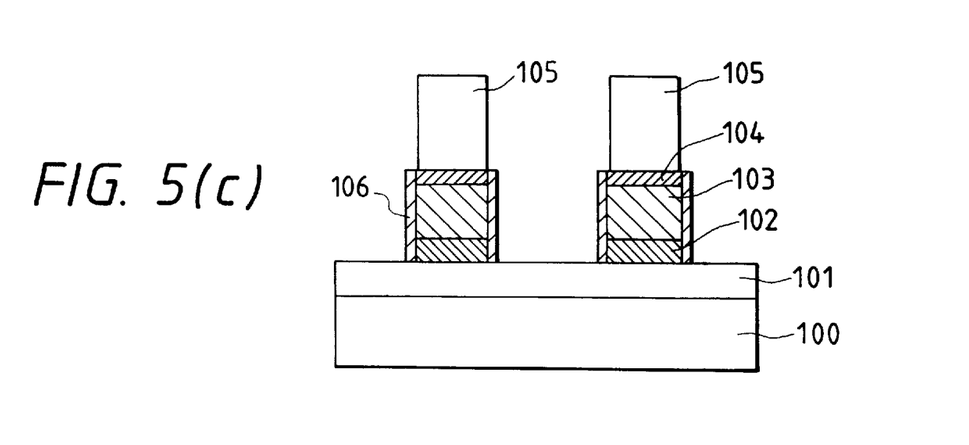

The case (2) is that Ar is added the etching gases of the case (1) and vertical etching is carried out as shown in FIG. 5(*c*), the thickness of the side wall protective film is limited by sputtering property of Ar and the side surface of each of the TiN cap layer 104, the Al—Cu alloy layer 103 and the TiN barrier layer 102 is processed vertically, and is covered with a side wall protective film 106 of by-products of etching, that is, organic components like C, CH etc. Therefore the side wall protective film 106 can be easily removed during post-etch treatment like a resist ashing etc.

In this case (2), the thickness of the side wall protective film can be controlled with easier way than that of the case (1) because of the addition of Ar gas.

That is to say, it is difficult to control the quantity of Ar gas because the quantity of Ar is initially small when using the case (1), however in the case (2), the quantity of Ar is large so that optimum gas ratio can be set easily. Therefore a desired etching shape can be obtained easily.

The case (2) process is suitable to the samples that are as follows. For example, the case is that mask area of the sample is 30% or below 30% of the whole upper surface of the sample, Or the thickness of the resist is thin, for example the case is that the thickness is 1 $\mu$m m or below 1 $\mu$m.

Or in the case that the quantity of etching the resist is small since selection ratio to the photoresist is large.

According to the above embodiment 4, a good shape of multi-layered metal wiring can be obtained without generating a notch of Al—Cu alloy layer under a TiN cap layer.

Furthermore it is easy to remove the resist layer 105 and side wall protective layer 106 after the etching step.

According to the present invention, the change of the processing shape hardly occurs even when 25 samples are continuously etched following the $O_2$ cleaning processing. In other words, the present invention can provide an etching method suitable for mass fabrication of the multi-layered Al wirings by carrying out periodically the $O_2$ cleaning processing.

Though this embodiment has confirmed the effect of the continuous processing of ordinary one lot of 25 samples, the continuous processing of more than 25 samples can be made by optimizing various conditions.

Needless to say, the present invention is effective for the continuous processing of samples of not greater than 25 sheets, such as 15 or 10 sheets. In this embodiment, the inner wall temperature of the etching chamber is set and controlled to 100° C., the similar effect can be obtained at a temperature within the range of 80 to 250° C. by suitably adjusting the $BCl_3/Cl_2/CH_4/Ar$ flow rate ratios. The guideline for the suitable mass flow rate ratios are 5 to 50 for $BCl_3$, 1 to 20 for $CH_4$ and 50 to 500 for Ar with respect to 100 for $Cl_2$. This embodiment represents the case where the $CH_4$ and Ar gases are added to $BCl_3/Cl_2$. Similar effects can be expected by using a mixed gas comprising at least one of $C_xH_yCl_z$ (where each of x, y and z is 0 to 8) and $C_xH_yBr_z$ (where each of x, y and z is 0 to 8) and at least one of Ar, Xe and Kr, but it has been found out from the experimental results that the addition of the $CH_4$ and Ar gases is effective. This embodiment uses $BCl_3/Cl_2$ as the etching gas but other chlorine type gases such as $SiCl_4$, $CCl_4$, etc, can be used effectively.

Though the TiN/Al—Cu alloy layer/TiN laminate film is etched in this embodiment, the upper and lower films of the Al—Cu alloy layer may be Ti/TiN film, a TiW film or a W film. Similar effects can be obtained in the case of an Al single-layered film (single-layered film of Al or Al alloy film) besides the laminate film. Though this embodiment uses an ECR type etching apparatus, other plasma etching apparatus such as an ICP (Inductively Coupled Plasma) etching apparatus can be used to obtain similar effects.

According to the present invention described above, the material containing carbon such as silicon carbide (SiC) is disposed inside the vacuum container serving as the discharge region and carbon (C) to be used as the material of the side wall protective film for vertical processing of the object article is supplied into the plasma from a source other than the photoresist. Therefore, the etching rate of the photoresist can be lowered and the selection ratio to the photoresist can be improved. For this reason, when the present invention is applied to the semiconductor production apparatus, particularly to the etching process of the metal wiring film, it becomes possible to eliminate the trade-off relation of processing accuracy and the processing shape with respect to the selection ratio, and to simultaneously satisfy processing accuracy, processing shape and selection ratio.

Furthermore when the present invention is employed, the multi-layered Al wiring can be etched into an excellent shape without generating the notches on the Al—Cu alloy layer 103 immediately below the TiN cap layer 104. Further, the resist film 105 and the side wall protective film 106 can be easily removed in the post-process of etching. Even when the present invention is applied to mass production, the change with time does not occur in the processing shape of the multi-layered Al wiring, and no problem is imparted to the maintenance property of the apparatus.

What is claimed is:

1. An etching method of a wiring material for etching a multi-layered or single-layered Al wiring formed on a semiconductor substrate, wherein a processing gas for etching is a mixed gas comprising at least one member selected from the group consisting of $BCl_3$, $Cl_2$, $CHCl_3$ or other $C_xH_yCl_z$ (where each of x, y and z is 0 to 8) and $C_xH_yBr_z$ (where each of x, y and z is 0 to 8) gases and at least one member selected from the group of Ar, Xe and Kr gases; and an organic component of carbon (C) and an organic component of CH included in a plasma form a side wall protective film of a sample being processed by $C_xH_y$ gas.

2. A semiconductor manufacturing method including processing a sample by generating plasma by an electromagnetic wave, wherein a material containing carbon is disposed at at least a part of the inside of a vacuum container as a discharge region; and a processing gas for etching is a mixed gas comprising at least one member selected from the group consisting of $BCl_3$, $Cl_2$, $CHCl_3$ or other $C_xH_yCl_z$ (where each of x, y and z is 0 to 8) and $C_xH_yBr_z$ (where each of x, y and z is 0 to 8) gases and at least one member selected from the group of Ar, Xe and Kr gases; and a surface of said material containing carbon is etched, so as to emit carbon into the plasma; and said carbon (C) emitted into the plasma, and an organic component of carbon (C) and an organic component of CH included in the plasma, form a side wall protective film of the sample.

3. The semiconductor manufacturing method according to claim 2, wherein the material containing carbon is separated from inner walls of the vacuum container.

4. An etching method of a wiring material according to claim 1, wherein said multi-layered or a single-layered Al wiring is etched by plasma by controlling a wall surface temperature of an etching chamber of an etching apparatus to a specified temperature of 80 to 250° C. and by using a mixed gas comprising at least one member selected from the group consisting of $BCl_3$, $Cl_2$, and $CHCl_3$ or other $C_xH_yCl_z$ (where each of x, y and z is 0 to 8) or $C_xH_yBr_z$ (where each of x, y and z is 0 to 8), and at least one member selected from the group consisting of Ar, Xe and Kr gases.

5. An etching method of a wiring material according to claim 1, wherein a mass low rate ratio of said $BCl_3$, $Cl_2$ and $CHCl_3$ or other $C_xH_yCl_z$ (each of x, y and z is 0 to 8) in said mixed gas is 5 to 50 for $BCl_3$, 1 to 20 for $CHCl_3$ or other $C_xH_yCl_z$ (each of x, y and z is 0 to 8) or $C_xH_yBr_z$ (each of x, y and z is 0 to 8) and 50 to 500 for Ar, Xe or Kr gas with $Cl_2$ being 100, and said multi-layered or single-layered Al wiring is etched by using an organic resist film as a mask.

6. An etching method of a wiring material according to claim 1 or 4, wherein said multi-layered or single-layered Al wiring on a plurality of semiconductor substrates is continuously etched after the inside of an etching chamber for conducting etching is cleaned by discharge of a gas containing $O_2$.

7. An etching method of a wiring material according to claim 1, wherein said multi-layered Al wiring is produced by laminating an Al—Cu alloy layer and a barrier metal of any one of a TiN film, a TiW film, a W film and a Ti film.

8. An etching method according to claim 1, wherein said sample has at most 30% photoresist patterned mask area to a whole upper surface of the sample.

9. An etching method according to claim 1, wherein said sample has at least 70% etched metal wiring area to a whole upper surface of the sample.

10. The semiconductor manufacturing method according to claim 2, wherein said sample has at most 30% photoresist patterned mask area to a whole upper surface of the sample.

11. The semiconductor manufacturing method according to claim 2, wherein said sample has at least 70% etched metal wiring area to a whole upper surface of the sample.

* * * * *